(12) United States Patent
Kawagoe

(10) Patent No.: US 10,937,707 B2
(45) Date of Patent: Mar. 2, 2021

(54) WIRING SUBSTRATE, ELECTRONIC DEVICE, AND ELECTRONIC MODULE

(71) Applicant: KYOCERA Corporation, Kyoto (JP)

(72) Inventor: Hiroshi Kawagoe, Kyoto (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 16/487,531

(22) PCT Filed: Feb. 22, 2018

(86) PCT No.: PCT/JP2018/006471
§ 371 (c)(1),
(2) Date: Aug. 21, 2019

(87) PCT Pub. No.: WO2018/155559
PCT Pub. Date: Aug. 30, 2018

(65) Prior Publication Data
US 2020/0058568 A1    Feb. 20, 2020

(30) Foreign Application Priority Data
Feb. 22, 2017   (JP) .............. JP2017-031224

(51) Int. Cl.
*H01L 23/13* (2006.01)
*H01L 23/04* (2006.01)
(Continued)

(52) U.S. Cl.
CPC .............. *H01L 23/13* (2013.01); *H01L 23/04* (2013.01); *H01L 23/043* (2013.01);
(Continued)

(58) Field of Classification Search
CPC ... H01L 23/043; H01L 23/053; H01L 23/055; H01L 23/057; H01L 23/49838;
(Continued)

(56) References Cited

U.S. PATENT DOCUMENTS

| | | | |
|---|---|---|---|
| 8,540,954 B2 * | 9/2013 | Olsen | B01D 53/78 423/220 |
| 8,716,872 B2 * | 5/2014 | Kwon | H01L 23/48 257/777 |

(Continued)

FOREIGN PATENT DOCUMENTS

| | | |
|---|---|---|
| JP | 2005-101095 A | 4/2005 |
| WO | 2009/044737 A1 | 4/2009 |
| WO | 2010/106839 A1 | 9/2010 |

*Primary Examiner* — David A Zarneke
(74) *Attorney, Agent, or Firm* — Volpe Koenig

(57) ABSTRACT

A wiring substrate includes an insulating substrate that is square in plan view, the insulating substrate having one main surface with a recess and an other main surface opposite to the one main surface, and external electrodes located on the other main surface of the insulating substrate and in a peripheral section of the insulating substrate. The external electrodes include first external electrodes and second external electrodes. In plan view, the first external electrodes are located at corners of the insulating substrate, and the second external electrodes are interposed between the first external electrodes. Each of the first external electrodes has a smaller area and a larger width in a direction orthogonal to each side of the insulating substrate than each of the second external electrodes.

10 Claims, 13 Drawing Sheets

(51) Int. Cl.
  *H01L 23/08* (2006.01)
  *H01L 23/15* (2006.01)
  *H01L 23/498* (2006.01)
  *H05K 3/34* (2006.01)
  *H01L 23/057* (2006.01)
  *H01L 23/043* (2006.01)
  *H01L 23/053* (2006.01)

(52) U.S. Cl.
  CPC .......... *H01L 23/053* (2013.01); *H01L 23/057* (2013.01); *H01L 23/08* (2013.01); *H01L 23/15* (2013.01); *H01L 23/49811* (2013.01); *H01L 23/49838* (2013.01); *H05K 3/341* (2013.01); *H05K 3/3457* (2013.01); *H05K 2201/097* (2013.01); *H05K 2201/09472* (2013.01); *H05K 2201/09727* (2013.01)

(58) Field of Classification Search
  CPC .............. H01L 23/49811; H01L 23/13; H05K 2201/09372; H05K 2201/097; H05K 2201/09727
  See application file for complete search history.

(56) References Cited

U.S. PATENT DOCUMENTS

| | | | |
|---|---|---|---|
| 2002/0100955 A1* | 8/2002 | Potter | H01L 24/73 257/522 |
| 2003/0114024 A1* | 6/2003 | Miyagawa | H05K 3/3436 439/68 |
| 2007/0132090 A1* | 6/2007 | Kuwabara | H05K 3/3436 257/700 |
| 2008/0217384 A1* | 9/2008 | Jayantha | H05K 3/3436 228/180.21 |
| 2009/0289357 A1* | 11/2009 | Fujimoto | H01L 24/05 257/737 |
| 2012/0002380 A1 | 1/2012 | Kato | |
| 2012/0241208 A1* | 9/2012 | Petersen | H01L 23/49838 174/266 |
| 2014/0103522 A1* | 4/2014 | Takemoto | H01L 24/81 257/737 |
| 2014/0376202 A1* | 12/2014 | Shibutani | H05K 3/3436 361/767 |

* cited by examiner

← DIRECTION A

FIG. 3A
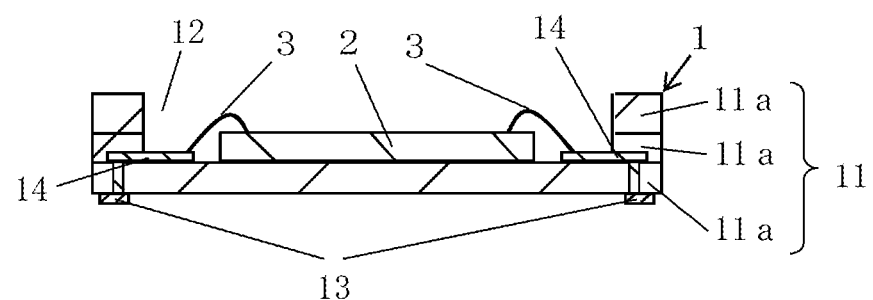
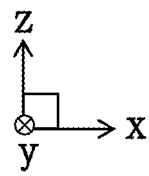
FIG. 3B
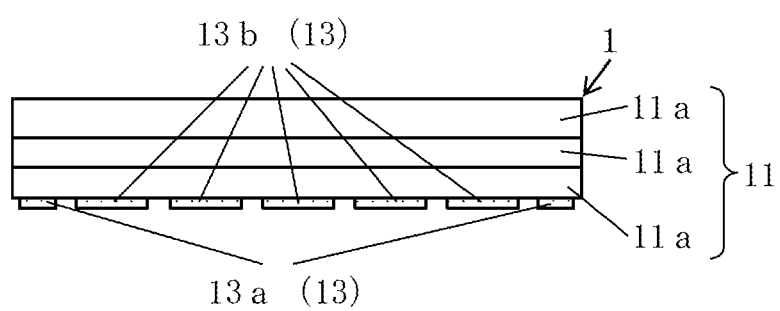
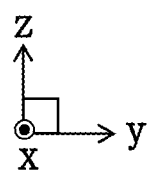

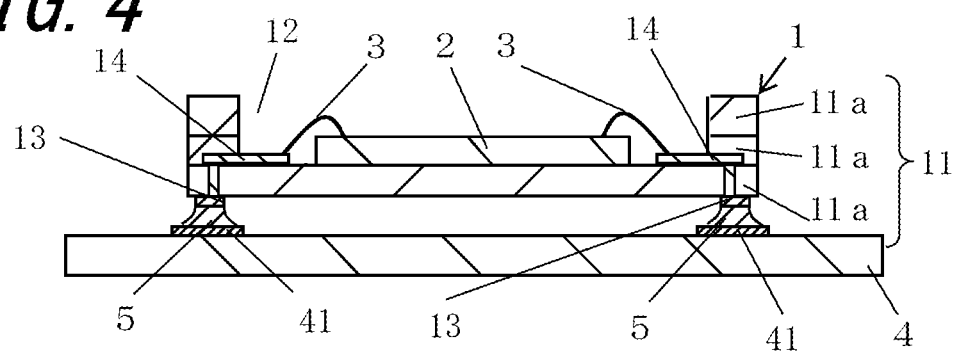
FIG. 4
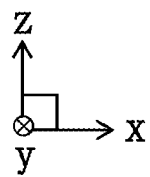

← DIRECTION A

FIG. 7A
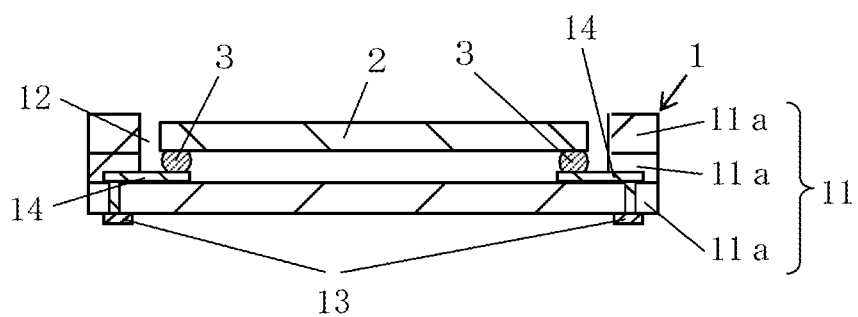
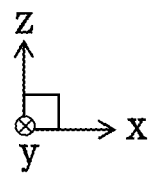
FIG. 7B
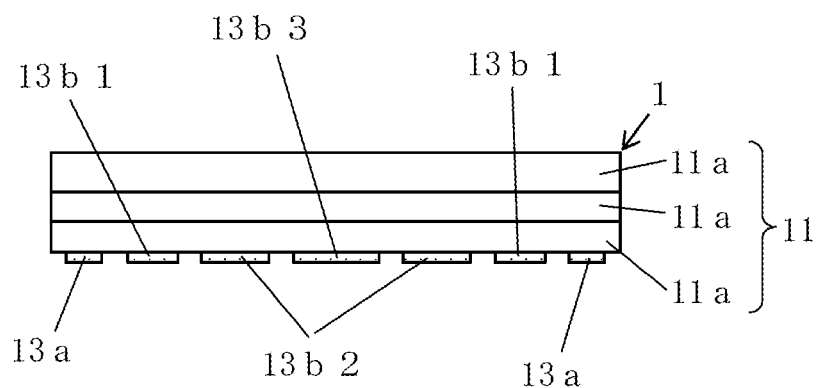
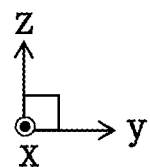

← DIRECTION A

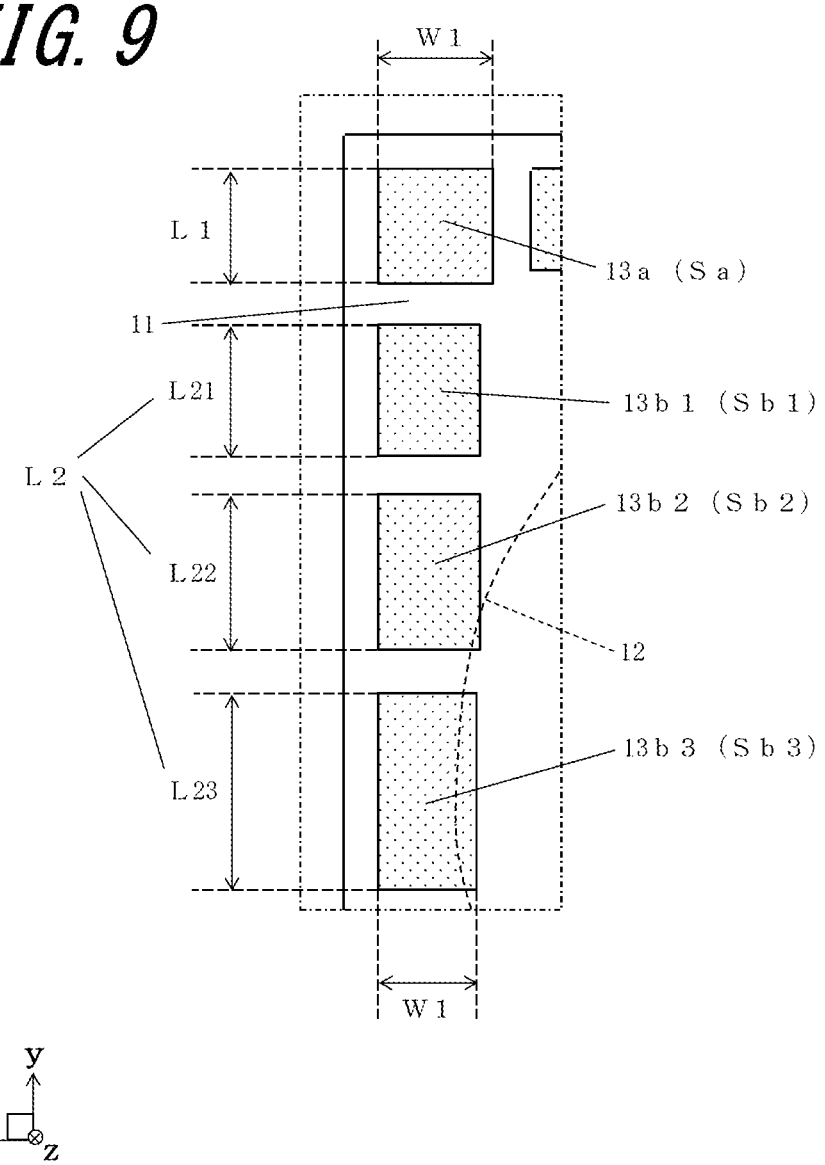

FIG. 10A
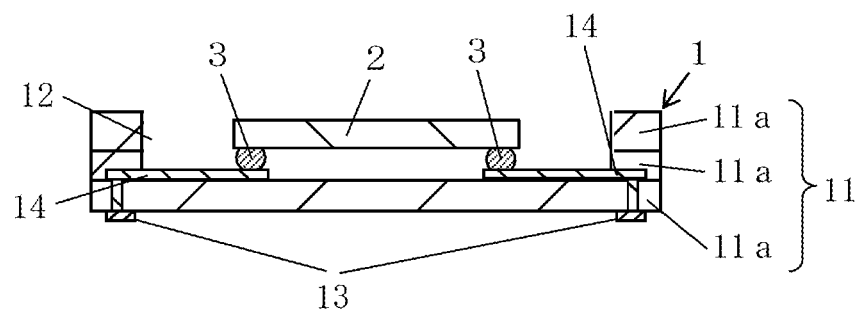
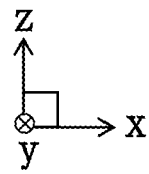
FIG. 10B
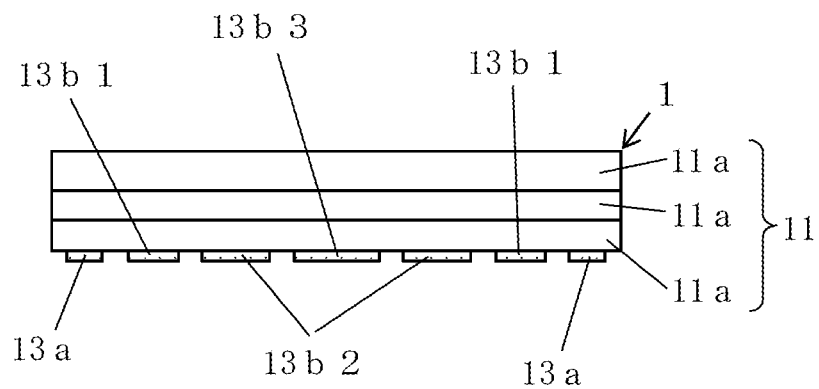
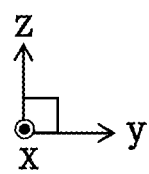

FIG. 13A
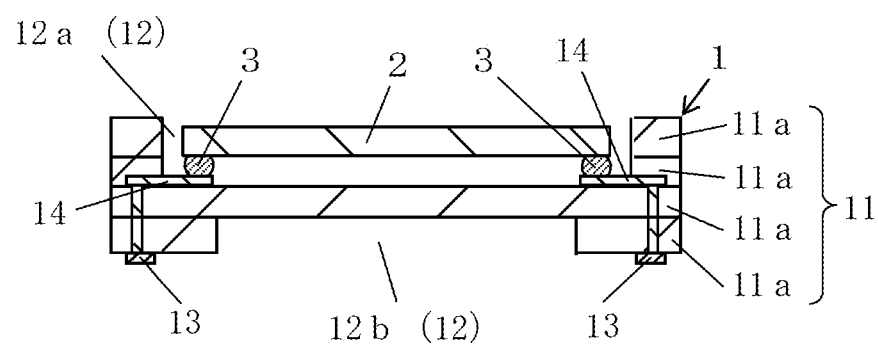
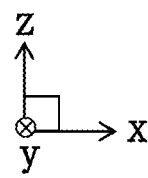
FIG. 13B
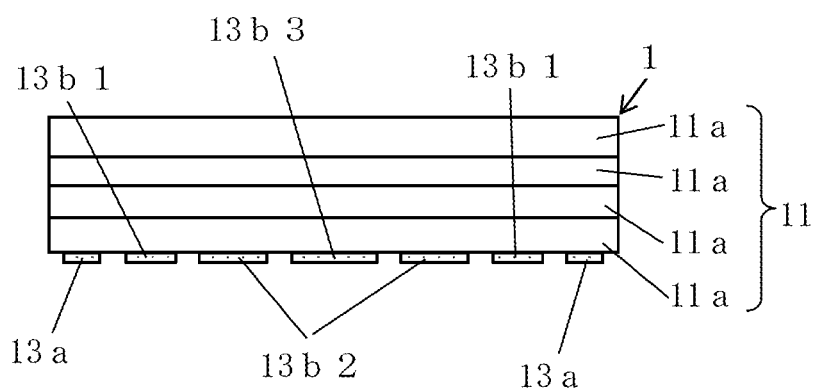
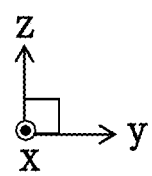

WIRING SUBSTRATE, ELECTRONIC DEVICE, AND ELECTRONIC MODULE

TECHNICAL FIELD

The present invention relates to a wiring substrate, an electronic device, and an electronic module.

BACKGROUND ART

Wiring substrates and electronic devices have been known, in which an electronic component is mounted on a main surface of an insulating substrate made of ceramics (Refer to, Japanese Unexamined Patent Application Publication No. 2005-101095).

In such wiring substrates, the insulating substrate has a recess for accommodating and mounting an electronic component on its upper surface, and external electrodes to be connected to a module substrate on its lower surface.

SUMMARY OF INVENTION

A wiring substrate of the present disclosure includes an insulating substrate being square in plan view, the insulating substrate having one main surface with a recess and an other main surface opposite to the one main surface, and external electrodes located on the other main surface of the insulating substrate and in a peripheral section of the insulating substrate. The external electrodes include first external electrodes and second external electrodes. In plan view, the first external electrodes are located at corners of the insulating substrate, and the second external electrodes are interposed between the first external electrodes. Each of the first external electrodes has a smaller area and a larger width in a direction orthogonal to each side of the insulating substrate than each of the second external electrodes.

According to an aspect of the present disclosure, an electronic device includes the wiring substrate having the above-mentioned configuration, and an electronic component mounted on the wiring substrate.

According to an aspect of the present disclosure, an electronic module includes a module substrate having a connection pad, and the electronic device having the above-mentioned configuration and connected to the connection pad via a solder.

BRIEF DESCRIPTION OF DRAWINGS

FIG. 3(A) is a vertical sectional view of the electronic device taken along a line A-A in FIG. 1(A), and FIG. 3(B) is a side view of the electronic device in FIG. 1(A) in an A direction.

FIG. 4 is a vertical sectional view of an electronic module having a module substrate that mounts the electronic device in FIG. 1 thereon.

FIG. 7(A) is a vertical sectional view of the electronic device taken along a line A-A in FIG. 5(A), and FIG. 7(B) is a side view of the electronic device in FIG. 5(A) in an A direction.

FIG. 9 is an enlarged bottom view of a main portion of an A portion of the electronic device in FIG. 8(B).

FIG. 10(A) is a vertical sectional view of the electronic device taken along a line A-A in FIG. 8(A), and FIG. 10(B) is a side view of the electronic device in FIG. 8(A) in an A direction.

FIG. 13(A) is a vertical sectional view of the electronic device taken along a line A-A in FIG. 11(A), and FIG. 13(B) is a side view of the electronic device in FIG. 11(A) in an A direction.

DESCRIPTION OF EMBODIMENTS

Figure 1A:
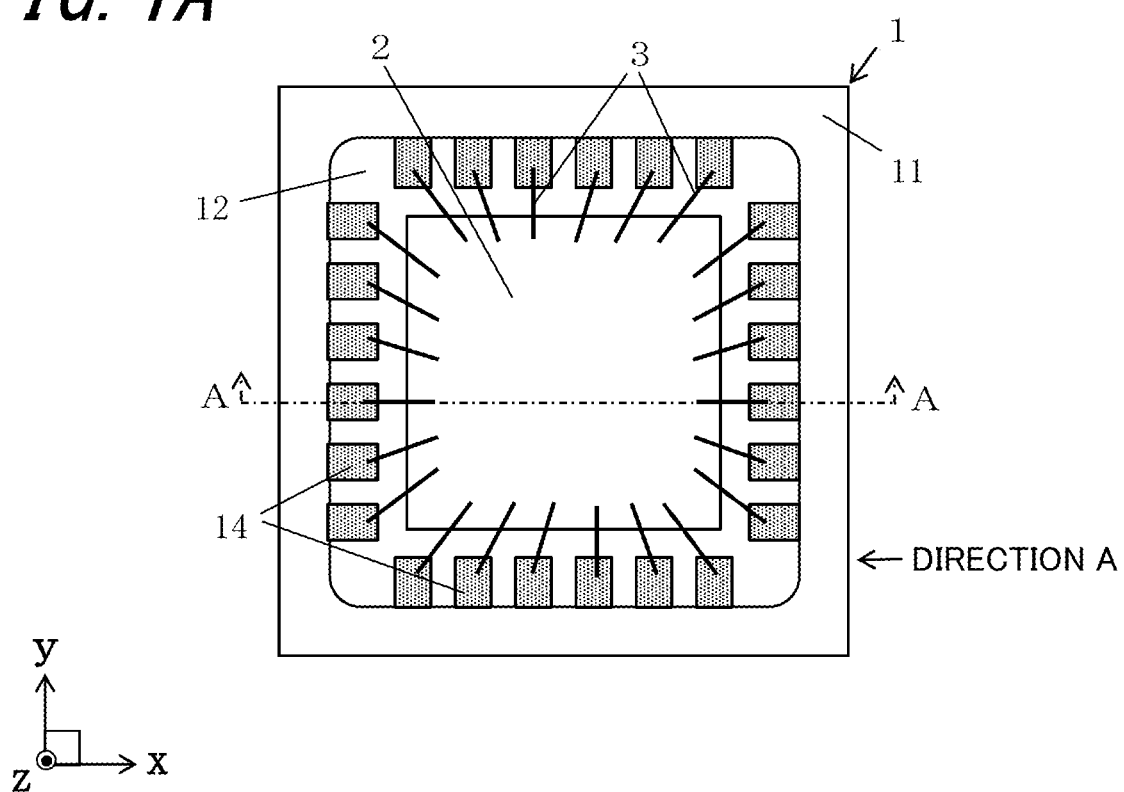
FIG. 1(A) is a top view of an electronic device in a first embodiment.

Some exemplary embodiments of the present disclosure will be described below with reference to the appended figures.

First Embodiment

As illustrated in FIGS. 1 to 4, an electronic device in a first embodiment includes a wiring substrate 1 and an electronic component 2 mounted in a recess 12 of the wiring substrate 1. As illustrated in FIG. 4, the electronic device is connected to a module substrate 4 constituting an electronic module by means of solders 5.

The wiring substrate 1 in this embodiment includes a square insulating substrate 11 in plan view having one main surface with a recess 12 and an other main surface opposite to the one main surface, and external electrodes 13 located on the other main surface of the insulating substrate 11 and in a peripheral section of the insulating substrate 11. The external electrodes 13 include first external electrodes 13a and second external electrodes 13b. The wiring substrate 1 has wiring conductors 14 in and on the insulating substrate 11. In plan view, the first external electrodes 13a are located at corners of the insulating substrate 11, and the second external electrodes 13b are interposed between the first external electrodes 13a. Each of the first external electrodes 13a has a smaller area and a larger width in a direction orthogonal to each side of the insulating substrate 11 than each of the second external electrodes 13b. In FIGS. 1 to 4, an upward direction refers to a positive direction along a virtual z axis. In following description, expressions related to upper and lower are used for the sake of convenience, and do not limit to the actual direction in use of the wiring substrate 1 and so on.

In the example illustrated in FIG. 1(A), the wiring conductors 14 are shaded. In the example illustrated in FIGS. 1(B), 2, and 3(B), the first external electrodes 13a and the second external electrodes 13b are shaded. In the example illustrated in FIGS. 1(B) and 2, in perspective plan view, an area overlapping with an inner wall of the recess 12 is represented by a dotted line.

The insulating substrate 11 has one main surface (upper face in FIGS. 1 to 4), the other main surface (lower face in FIGS. 1 to 4) opposite to the one main surface, and a side face. The insulating substrate 11 is configured of a plurality of insulating layers 11a, and has the recess 12 that is opened to the one main surface and mounts the electronic component 2 thereon. In plan view, that is, when viewed from the direction perpendicular to the one main surface, the insulating substrate 11 is shaped like a square plate. The insulating substrate 11 functions as a support body for supporting the electronic component 2, and the electronic component 2 is fixedly adhered to a mounting portion of a bottom surface of the recess 12 via connection members 3 such as solder bumps, gold bumps, conductive resins (for example, anisotropic conductive resins), and other resins.

The insulating substrate 11 may be made of ceramic, for example, an aluminum oxide sintered body (alumina ceramics), an aluminum nitride sintered body, a silicon nitride sintered body, a mullite sintered body, or a glass ceramic sintered body. When the insulating substrate 11 is the aluminum oxide sintered body, a suitable organic binder and solvent are added to raw powders such as aluminum oxide ($Al_2O_3$), silicon oxide ($SiO_2$), magnesium oxide (MgO), calcium oxide (CaO), and they are mixed to prepare a slurry. The slurry is shaped into a sheet according to the well-known doctor blade or calendar roll to prepare a ceramic green sheet. Next, the ceramic green sheet is properly punched. A plurality of the punched ceramic green sheets is laminated to form a raw compact, and the raw compact is fired at high temperatures (about 1600 degrees) to produce the insulating substrate 11.

Figure 1B:
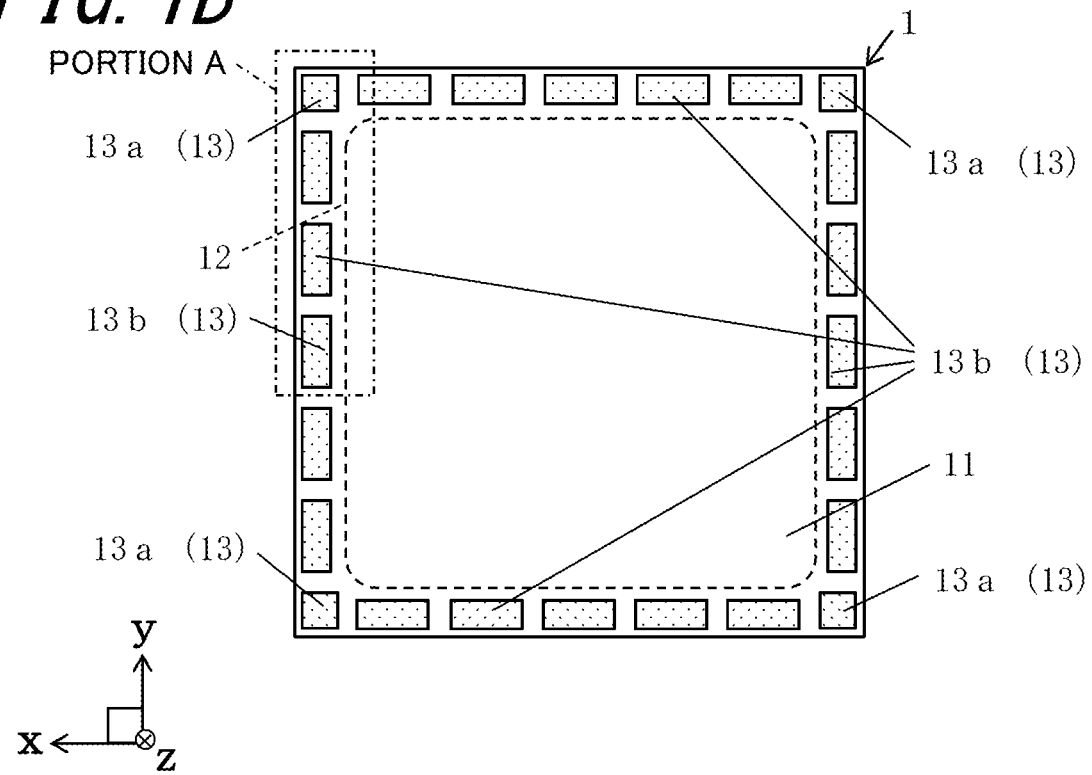
FIG. 1(B) is a bottom view of the electronic device in FIG. 1(A).
Figure 2:
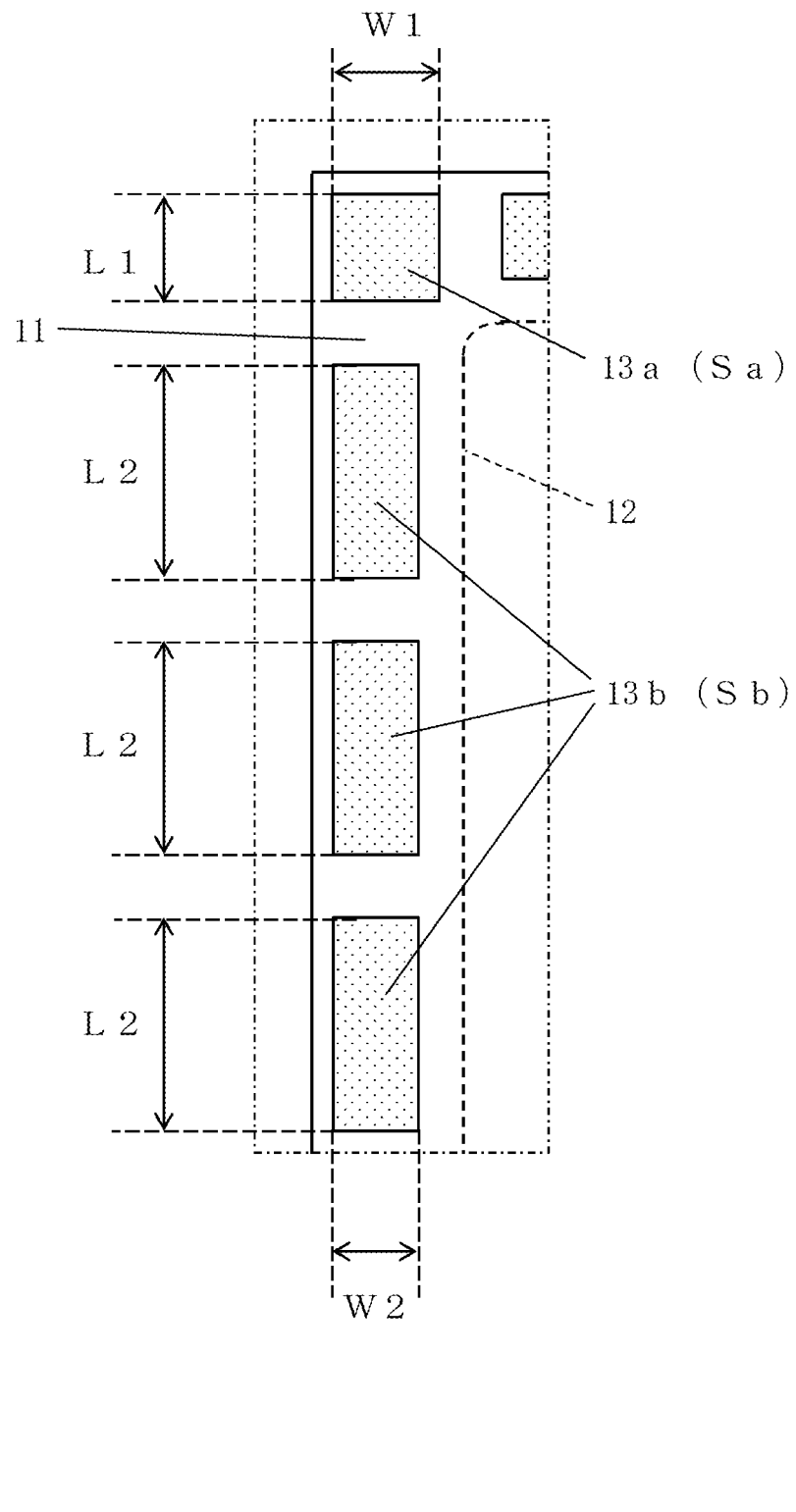
FIG. 2 is an enlarged bottom view of a main portion of an A portion of the electronic device in FIG. 1(B).

In the example illustrated in FIGS. 1 and 2, the recess 12 is located at the one main surface of the insulating substrate 11. The recess 12 serves to mount the electronic component 2 on the bottom face. In the example illustrated in FIG. 1, the recess 12 is shaped like a square with arc-like corners in plan view, and is located at a center of the insulating substrate 11. In the example illustrated in FIGS. 1 to 3, the insulating substrate 11 is configured of three of the insulating layers 11a, and the recess 12 is provided in the first and second insulating layers 11a from the side of the one main surface.

The square recess 12 includes the rectangular recess 12 having arc-like corners as in the example illustrated in FIG. 1(A), and the rectangular recess 12 having notches at corners or sides.

For example, the recess 12 can be formed by making through holes in some of the ceramic green sheets for the insulating substrate 11 by laser machining, punching with a mold, or the like, and laminating the ceramic green sheets on other ceramic green sheets having no through hole.

The external electrodes 13 and the wiring conductors 14 are located on and in the insulating substrate 11. The external electrodes 13 and the wiring conductors 14 serve to electrically connect the electronic component 2 to the module substrate 4. In the example illustrated in FIGS. 1 to 3, the external electrodes 13 are disposed on the other main surface of the insulating substrate 11. As in the example illustrated in FIGS. 1 to 3, the wiring conductors 14 each include a through conductor for electrically connecting a wiring layer located on the surface of the insulating layer 11a constituting the insulating substrate 11 to wiring layers vertically passing through the insulating layers 11a constituting the insulating substrate 11, or electrically connecting the wiring layer to the external electrode 13. In the example illustrated in FIGS. 1 to 3, the wiring conductors 14 each have one end connected to the bottom surface of the recess 12 and the other end connected to the respective external electrodes 13.

The external electrodes 13 and the wiring conductors 14 are metallized metal powders containing tungsten (W), molybdenum (Mo), manganese (Mn), silver (Ag), or copper (Cu) as a main component. For example, when the insulating substrate 11 is formed of an aluminum oxide sintered body, a metallized paste is acquired by adding a suitable organic binder and solvent to high-melting-point metal powders of W, Mo, Mn or the like and mixing them. Then, the metallized paste is printed in advance onto the ceramic green sheet for the insulating substrate 11 in a predetermined pattern by screen printing, and is fired together with the ceramic green sheet for the insulating substrate 11 to be adhered at predetermined positions of the insulating substrate 11. For example, the external electrodes 13 and the wiring conductors 14 are formed by printing the metallized paste for the external electrodes 13 or the wiring conductors 14 onto the ceramic green sheet for the insulating substrate 11 by printing means such as screen printing, and are fired together with the ceramic green sheet for the insulating substrate 11. For example, the through conductors are formed by making through holes for the through conductors in the ceramic green sheet for the insulating substrate 11 by punching using a mold, laser machining, or any other suitable processing, and filling the metallized paste for the through conductors into the through holes by the above-mentioned printing and then, firing the metallized paste together with the ceramic green sheet for the insulating substrate 11. The metallized paste is prepared by adding a suitable solvent and binder to the above-mentioned metal powders, and kneading them into suitable viscosity. To increase the joining strength with the insulating substrate 11, glass powders or ceramic powders may be contained.

The external electrodes 13 are located at the peripheral section of the insulating substrate 11. In the example illustrated in FIGS. 1 to 3, twenty-four external electrodes 13 are arranged in a row in the peripheral section of the insulating substrate 11. The external electrodes 13 are arranged in a row in the peripheral section of the insulating substrate 11, which means that three or more of the external electrodes 13 are disposed along one side of the insulating substrate 11. In the example illustrated in FIGS. 1 to 3, seven external electrodes 13 are aligned along each side of the insulating substrate 11. For example, on each side, two first external electrodes 13a are located at respective corners of the insulating substrate 11, and five second external electrodes 13b are interposed between the two first external electrodes 13a. The external electrodes 13 are located along the recess 12 in perspective plan view.

As in the example illustrated in FIGS. 1 and 2, an area Sa of the first external electrode 13a is smaller than an area Sb of the second external electrode 13b, that is, Sa<Sb. The area Sb of the second external electrode 13b may be 1.05 to 3.00 times as much as the area Sa of the first external electrode 13a (1.05 Sa≤Sb≤3.00 Sa).

As in the example illustrated in FIGS. 1 to 3, the width of the first external electrode 13a is larger than the width of the second external electrode 13b in a direction orthogonal to each side of the insulating substrate 11. That is, a width W1 of the first external electrode 13a is larger than a width W2 of the second external electrode 13b. The width W1 of the first external electrode 13a may be 1.1 to 2.0 times as large as the width W2 of the second external electrode 13b. A length L2 of the second external electrode 13b is larger than a length L1 of the first external electrode 13a, that is, L2>L1. Here, the length of the external electrode 13 refers to a length in a direction parallel to each side of the insulating substrate 11.

In the example illustrated in FIG. 1, the two first external electrodes 13a on the insulating substrate 11 each have a smaller area and a larger width in the direction orthogonal to each side of the insulating substrate than the second external electrode 13b. In the example illustrated in FIG. 1, the first external electrodes 13a located at the corners of the insulating substrate 11 each have a smaller area and a larger width in the direction orthogonal to each side of the insulating substrate 11 than the second external electrode 13b, on two sides adjacent to each other at the corner of the insulating substrate 11.

A metal plating layer is adhered to each of exposed surfaces of the external electrodes 13 and the wiring conductors 14 on the insulating substrate 11 by electroplating or electroless plating. The metal plating layer is made of metal having good corrosion resistance and connectivity to connection member, for example, nickel, copper, gold, or silver. For example, a nickel plating layer having a thickness in the range of about 0.5 to 5 μm and a gold plating layer having a thickness in the range of about 0.1 to 3 μm are sequentially adhered. This can effectively suppress corrosion of the external electrodes 13 and the wiring conductors 14, and strengthen the bonding between the electronic component 2 and the wiring conductor 14, the bonding between the wiring conductor 14 and the connection member 3 such as a bonding wire, and the bonding between the external electrode 13 and a connection pad 41 disposed on the module substrate 4.

The metal plating layer is not limited to the nickel plating layer/gold plating layer, and may be other metal plating layers including nickel plating layer/palladium plating layer/gold plating layer.

The electronic component 2 may be mounted on the bottom surface of the recess 12 of the wiring substrate 1 to produce the electronic device. Examples of the electronic component 2 mounted on the wiring substrate 1 include: semiconductor elements such as IC chips and LSI chips; light-emitting elements; piezoelectric elements such as quartz oscillators and piezoelectric vibrators; and various sensors. For example, when the electronic component 2 is a wire bonding-type semiconductor element, the semiconductor element is fixed to the bottom surface of the recess 12 using a bonding member such as a low-melting-point brazing material or conductive resin. Then, electrodes of the semiconductor element are electrically connected to the respective wiring conductors 14 via the connection members 3 such as bonding wires. As a result, the electronic component 2 is mounted on the wiring substrate 1. In this manner, the electronic component 2 is electrically connected to the wiring conductors 14. For example, when the electronic component 2 is a flip chip-type semiconductor element, the semiconductor element is mounted on the wiring substrate 1 by electrically and mechanically connecting electrodes of the semiconductor element to the respective wiring conductors 14 via the connection members 3 such as solder bumps, gold bumps, or conductive resins (ex. anisotropic conductive resins). The plurality of electronic components 2, or as needed, a small electronic component such as a resistance element or a capacitive element may be mounted on the bottom surface of the recess 12 of the wiring substrate 1. As needed, the electronic component 2 is encapsulated with an encapsulation member such as resin or glass, or that is sealed with a lid made of resin, glass, ceramic, or metal.

For example, as illustrated in FIG. 4, the external electrodes 13 of the electronic device in this embodiment are connected to the respective connection pads 41 of the module substrate 4 via the solders 5 to constitute an electronic module. For example, as illustrated in FIG. 4, in the electronic device, the external electrodes 13 disposed on the other main surface of the wiring substrate 1 are connected to the respective connection pads 41 of the module substrate 4.

The wiring substrate 1 in this embodiment includes the square insulating substrate 11 in plan view having one main surface with the recess 12 and the other main surface opposite to the one main surface, and the external electrodes 13 located on the other main surface of the insulating substrate 11 and in the peripheral section of the insulating substrate 11. The external electrodes 13 include the first external electrodes 13a and the second external electrodes 13b. In plan view, the first external electrodes 13a are located at the corners of the insulating substrate 11, and the second external electrodes 13b are interposed between the first external electrodes 13a. The first external electrodes 13a each have a smaller area and a larger width in the direction orthogonal to each side of the insulating substrate 11 than the second external electrodes 13b. With the above-mentioned configuration, for example, when the electronic device including the wiring substrate 1 is connected to the module substrate 4 via the solders 5, by decreasing the areas of the first external electrodes 13a to reduce the volumes of the solders 5 for connecting the first external electrodes 13a to the module substrate 4, in plan view, the volumes of the solders 5 for connecting the second external electrodes 13b between the first external electrodes 13a to the module substrate 4 can be increased to improve the connection between the second external electrodes 13b interposed between the first external electrodes 13a in plan view, and the module substrate 4. Further, by increasing the widths of the first external electrodes 13a in the direction orthogonal to each side of the insulating substrate 11, the connection between the first external electrodes 13a and the module substrate 4 can be improved.

As in the example illustrated in FIG. 1(B), on two opposed sides of the insulating substrate 11, given that the first external electrodes 13a located at the corners of the insulating substrate 11 each have a smaller area and a larger width in the direction orthogonal to each side of the insulating substrate 11 than the second external electrodes 13b interposed between the first external electrodes 13a in plan view, when the electronic device including the wiring substrate 1 is connected to the module substrate 4 via the solders 5, the external electrodes 13 and the solders 5 are disposed on the two opposed sides of the insulating substrate 11 in a well-balanced manner, thereby improving the connection between the external electrodes 13 and the module substrate 4.

As in the example illustrated in FIG. 1(B), on four sides of the insulating substrate 11, given that the first external electrodes 13a located at the corners of the insulating substrate 11 each have a smaller area and a larger width in the direction orthogonal to each side of the insulating substrate 11 than the second external electrodes 13b interposed between the first external electrodes 13a, when the electronic device including the wiring substrate 1 is connected to the module substrate 4 via the solders 5, the external electrodes 13 and the solders 5 are disposed on the four sides of the insulating substrate 11, that is, the entire outer edge of the insulating substrate 11 in a well-balanced manner, thereby improving the connection between the external electrodes 13 and the module substrate 4.

As in the example illustrated in FIGS. 1 to 3, in perspective plan view, given that the first external electrodes 13a and the recess 12 do not overlap each other, even if the wiring substrate 1 protrudingly deforms toward the opening of the recess 12 in the thickness direction of the wiring substrate 1 due to a difference in thermal contraction ratio between the bottom surface of the recess 12 and the side wall of the recess 12 during manufacturing of the wiring substrate 1, the deformation of the first external electrodes 13a located at the corners of the insulating substrate 11 is small. Therefore, for example, when the electronic device including the wiring substrate 1 is connected to the module substrate 4 via the solders 5, the connection between the first external electrodes 13a and the module substrate 4 can be improved.

As in the example illustrated in FIGS. 1 to 3, given that the length L1 in the direction parallel to each side of the insulating substrate 11 is equal to the width W1 in the direction orthogonal to each side of the insulating substrate 11 in the first external electrodes 13a, that is, L1=W1, for example, when the electronic device including the wiring substrate 1 is connected to the module substrate 4 via the solders 5, it is less likely to cause a deviation in strength of the connection between the first external electrodes 13a and the module substrate 4, thereby improving the connection between the first external electrodes 13a and the module substrate 4. Here, the length L1 in the direction parallel to each side of the insulating substrate 11 is equal to the width W1 in the direction orthogonal to each side of the insulating substrate 11, which means a variation of about 5% is allowed. That is, 0.95 W1≤L1≤1.05 W1 is allowable.

A difference in width between the first external electrode 13a and the second external electrode 13b in the direction orthogonal to each side of the insulating substrate 11 is equal to a difference in width between the first external electrode 13a and the second external electrode 13b in the direction orthogonal to a side adjacent to the side of the insulating substrate 11. For example, in the example illustrated in FIG. 1, when the difference in width on the side in the X direction is equal to the difference in width on the side in the Y direction, it is less likely to cause a deviation in strength of the connection between the external electrodes 13 and the module substrate 4 on the two adjacent sides of the insulating substrate 11, thereby further improving the connection between the external electrodes 13 and the module substrate 4 of the insulating substrate 11.

The square recess 12 includes the rectangular recess 12 having arc-like corners as in the example illustrated in FIG. 1(A), and the rectangular recess 12 having notches at corners or sides.

The electronic device in this embodiment includes the wiring substrate 1 having the above-mentioned configuration, and the electronic component 2 mounted on the wiring substrate 1, achieving good airtightness and long-term reliability.

The electronic module in this embodiment includes the module substrate 4 having the connection pads 41, and the electronic device having the above-mentioned configuration and connected to the connection pads 41 via the solders 5, achieving good long-term reliability.

The wiring substrate 1 in this embodiment may be suitably used in a compact and high-output electronic device, and enhance airtightness of the recess 12 in the wiring substrate 1. For example, when a light-emitting element such as LED or LD is mounted as the electronic component 2 on the bottom surface of the recess 12, the wiring substrate 1 may be suitably used as a wiring substrate 1 for a slim and high-luminance light-emission device.

Second Embodiment

Figure 5A:
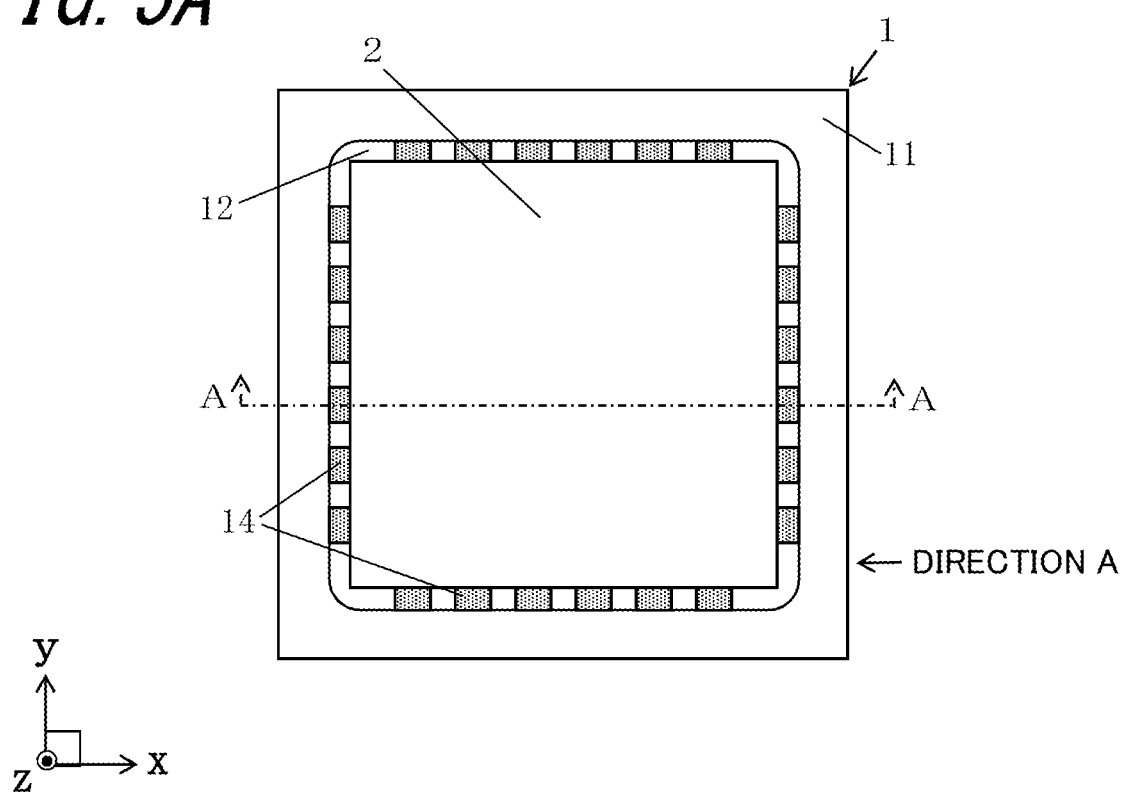
FIG. 5(A) is a top view of an electronic device in a second embodiment.

Next, an electronic device in a second embodiment will be described below with reference to FIGS. 5 to 7.

Figure 5B:
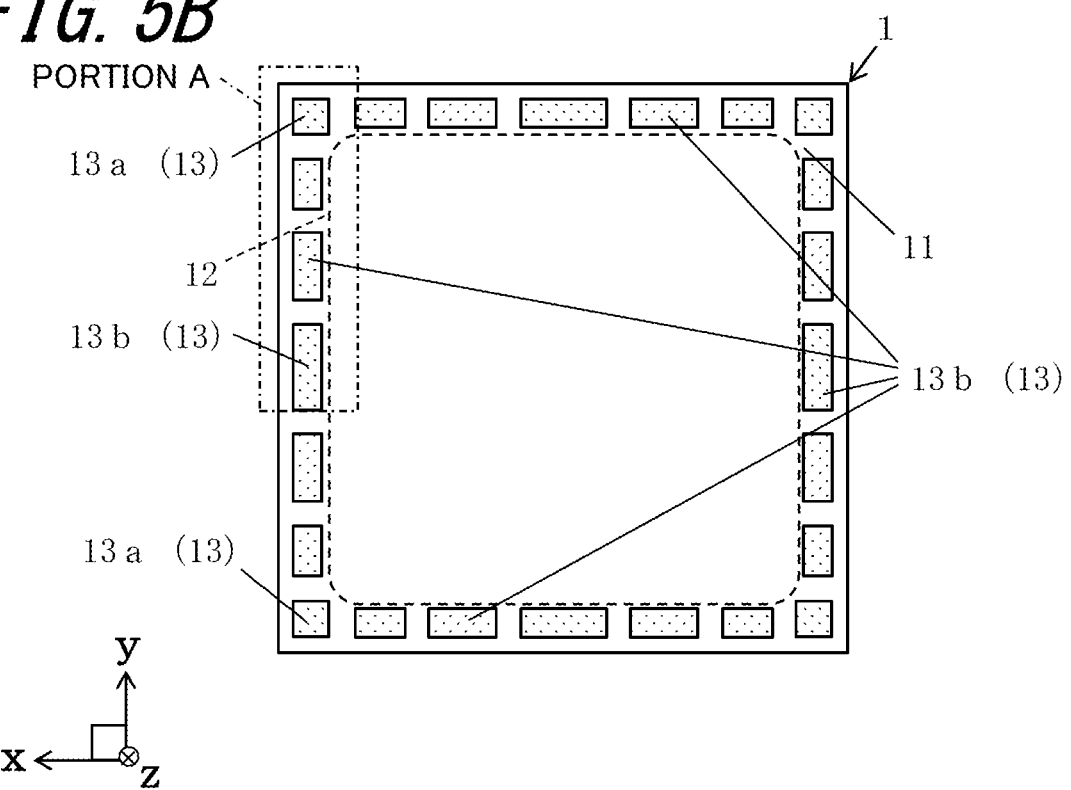
FIG. 5(B) is a bottom view of the electronic device in FIG. 5(A).

The electronic device in the second embodiment is different from the electronic device in the first embodiment in that the areas of the external electrodes 13 become gradually larger from the first external electrodes 13a located at the corners of the insulating substrate 11 toward the second external electrode 13b located at the center of each side. In the example illustrated in FIG. 5(A), the wiring conductors 14 are shaded. In the example illustrated in FIGS. 5(B), 6, and 7(B), the external electrodes 13 are shaded. As illustrated in FIGS. 5(B) and 6, in perspective plan view, an area overlapping with an inner wall of the recess 12 is represented by a dotted line.

In the wiring substrate 1 in the second embodiment, like the wiring substrate 1 in the first embodiment, for example, when the electronic device including the wiring substrate 1 is connected to the module substrate 4 via the solders 5, by decreasing the areas of the first external electrodes 13a to reduce the volumes of the solders 5 for connecting the first external electrodes 13a to the module substrate 4, in plan view, the volume of the solders 5 for connecting the second external electrodes 13b interposed between the first external electrodes 13a to the module substrate 4 can be increased, thereby improving the connection between the second external electrodes 13b interposed between the first external electrodes 13a in plan view, and the module substrate 4. Further, by increasing the widths of the first external electrodes 13a in the direction orthogonal to each side of the insulating substrate 11, the connection between the first external electrode 13a and the module substrate 4 can be improved.

Figure 6:
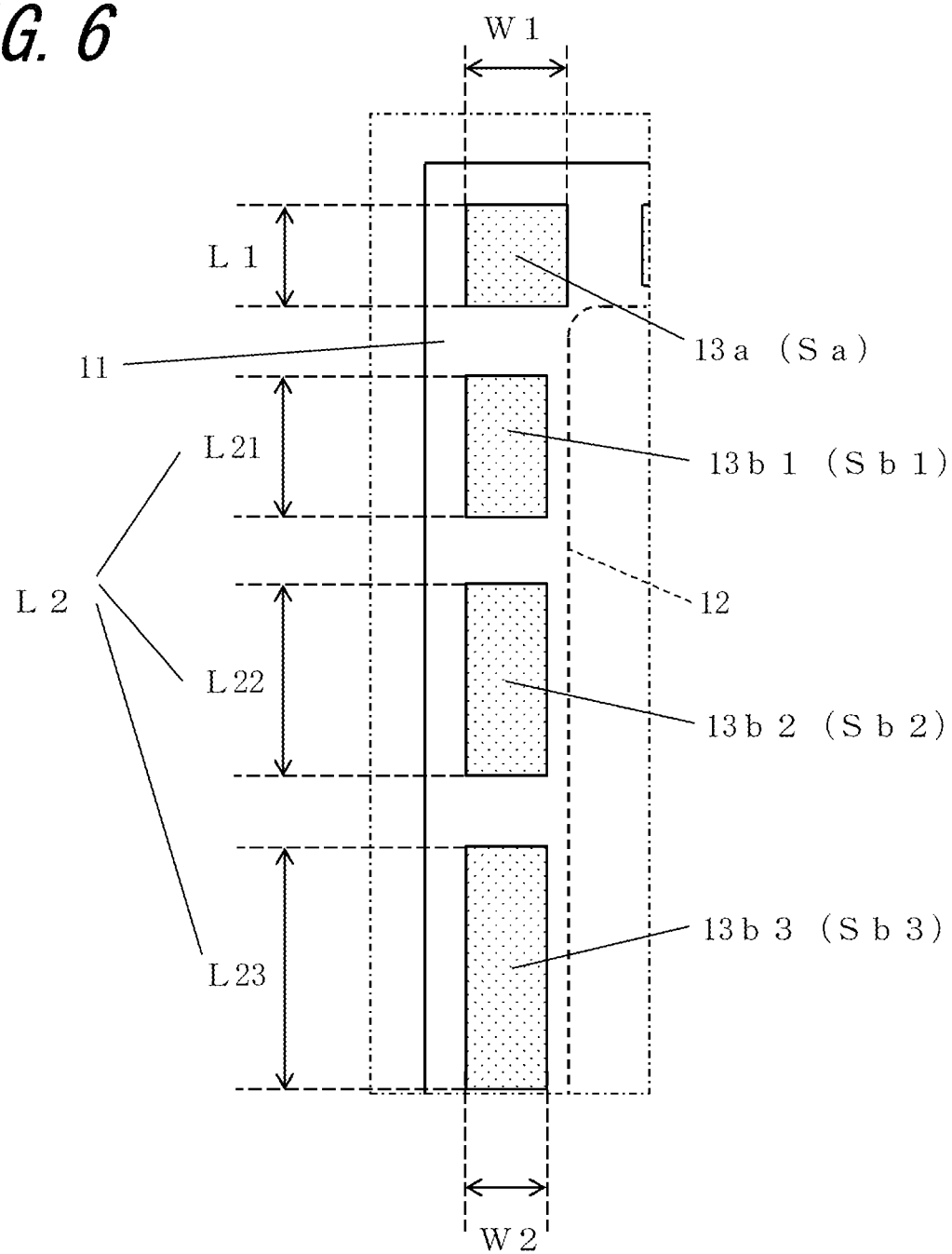
FIG. 6 is an enlarged bottom view of a main portion of an A portion of the electronic device in FIG. 5(B).

In the example illustrated in FIGS. 5 to 7, like the wiring substrate 1 in the first embodiment, the external electrodes 13 are disposed along the recess 12 in perspective plan view. In plan view, when two of the second external electrodes 13b are disposed across the center of each side of the insulating substrate 11, the areas of the external electrodes 13 may be set to become gradually larger from the first external electrode 13a located at the corner of the insulating substrate 11 toward the second external electrode 13b located at the center of each side, which is nearer to the corner of the insulating substrate 11 than the center.

In the example illustrated in FIGS. 5 to 7, twenty-four external electrodes 13 are arranged in a row in the peripheral section of the insulating substrate 11. In the example illustrated in FIGS. 5 to 7, seven external electrodes 13 are aligned along each side of the insulating substrate 11. The two first external electrodes 13a are located at the respective corners of the insulating substrate 11, and five second external electrodes 13b are interposed between the two first external electrodes 13a. In the example illustrated in FIGS. 5 to 7, the external electrodes 13 include the first external electrodes 13a located at the corners of the insulating substrate 11, and the second external electrodes 13b interposed between the first external electrodes 13a, that is, 2-1 external electrodes 13b1, 2-2 external electrodes 13b2, and 2-3 external electrodes 13b3. These external electrodes 13 are aligned from the corner to the center of each side of the insulating substrate 11 in the order of the first external electrodes 13a, the 2-1 external electrodes 13b1, the 2-2 external electrodes 13b2, and the 2-3 external electrode 13b3. Given that the area of the 2-1 external electrode 13b1 is Sb1, the area of the 2-2 external 13b2 is Sb2, and the area of the 2-3 external electrode 13b3 is Sb3 in plan view, the areas of the external electrodes 13 are set to become gradually larger from the corner toward the center of the insulating substrate 11, that is, Sa<Sb1<Sb2<Sb3. In the wiring substrate 1 in the second embodiment, like the wiring substrate 1 in the first embodiment, the area Sb of the second external electrode 13b may be 1.05 to 3.00 times as large as the area Sa of the first external electrode 13a (1.05 Sa≤Sb1<Sb2<Sb3≤3.00 Sa). When the areas of the external electrodes 13 become gradually larger from the corner toward the center of each side of the insulating substrate 11, the difference in area ratio between the adjacent external electrodes 13 is preferably 20% or less. For example, in the example illustrated in FIGS. 5 to 7, the difference between Sb1/Sa and Sb2/Sb1 and the difference between Sb2/Sb1 and Sb3/Sb2 each are preferably 20% or less.

When two second external electrodes 13b are symmetrically located across the center of each side of the insulating substrate 11, each of the two second external electrodes 13b symmetrically located across the center of each side of the insulating substrate 11 may be regarded as the second external electrode 13b located at the center of each side of the insulating substrate 11. Each of the areas of the second external electrodes 13b becomes gradually larger from the first external electrodes 13a located at the corners of the insulating substrate 11 toward the center of each side of the insulating substrate 11.

As in the example illustrated in FIGS. 5 to 7, the first external electrodes 13a each have a larger width in the direction orthogonal to each side of the insulating substrate 11 than the second external electrodes 13b. That is, the width W1 of the first external electrode 13a is larger than the width W2 of the second external electrode 13b. In the example illustrated in FIGS. 5 to 7, the width W2 of each of the second external electrodes 13b, that is, the 2-1 external electrodes 13b1, the 2-2 external electrodes 13b2, and the 2-3 external electrodes 13b3 is uniform. The length L2, more specifically, L21, L22, L23 becomes gradually larger from the corner to the center of each side of the insulating substrate 11. That is, L1<L21<L22<L23 is satisfied.

Providing that the areas of the external electrodes 13 become gradually larger from the corner to the center of each side of the insulating substrate 11, even if the wiring substrate 1 protrudingly deforms toward the opening of the recess 12 in the thickness direction of the wiring substrate 1 due to a difference in thermal contraction ratio between the bottom surface of the recess 12 and the side wall of the recess 12 during manufacturing of the wiring substrate 1, for example, when the electronic device including the wiring substrate 1 is connected to the module substrate 4 via the solders 5, according to the gradually-increasing deformation from the corners toward the center of the insulating substrate 11, the volume of the solder along each side of the insulating substrate 11 in the wiring substrate 1 can be gradually increased from the corners toward the center of each side, thereby further improving connection between the external electrodes 13 and the module substrate 4.

As in the example illustrated in FIG. 5(B), on two opposed sides of the insulating substrate 11, given that each of the first external electrodes 13a located at the corners of the insulating substrate 11 has a smaller area and a larger width in the direction orthogonal to each side of the insulating substrate 11 than each of the second external electrodes 13b interposed between the first external electrodes 13a, for example, when the electronic device including the wiring substrate 1 is connected to the module substrate 4 via the solders 5, the external electrodes 13 and the solders 5 can be disposed on two opposed sides of the insulating substrate 11 in a well-balanced manner, thereby improving connection between the external electrodes 13 and the module substrate 4.

As in the example illustrated in FIG. 5(B), on four sides of the insulating substrate 11, given that each of the first external electrodes 13a located at the corners of the insulating substrate 11 has a smaller area and a larger width in the direction orthogonal to each side of the insulating substrate 11 than each of the second external electrodes 13b interposed between the first external electrodes 13a, for example, when the electronic device including the wiring substrate 1 is connected to the module substrate 4 via the solders 5, the external electrodes 13 and the solders 5 can be disposed on the four sides of the insulating substrate 11, that is, the entire outer edge of the insulating substrate 11 in a well-balanced manner, thereby further improving connection between the external electrodes 13 and the module substrate 4.

The wiring substrate 1 in the second embodiment can be manufactured in the similar configuration to the wiring substrates 1 in the above-mentioned embodiment.

Third Embodiment

Figure 8A:
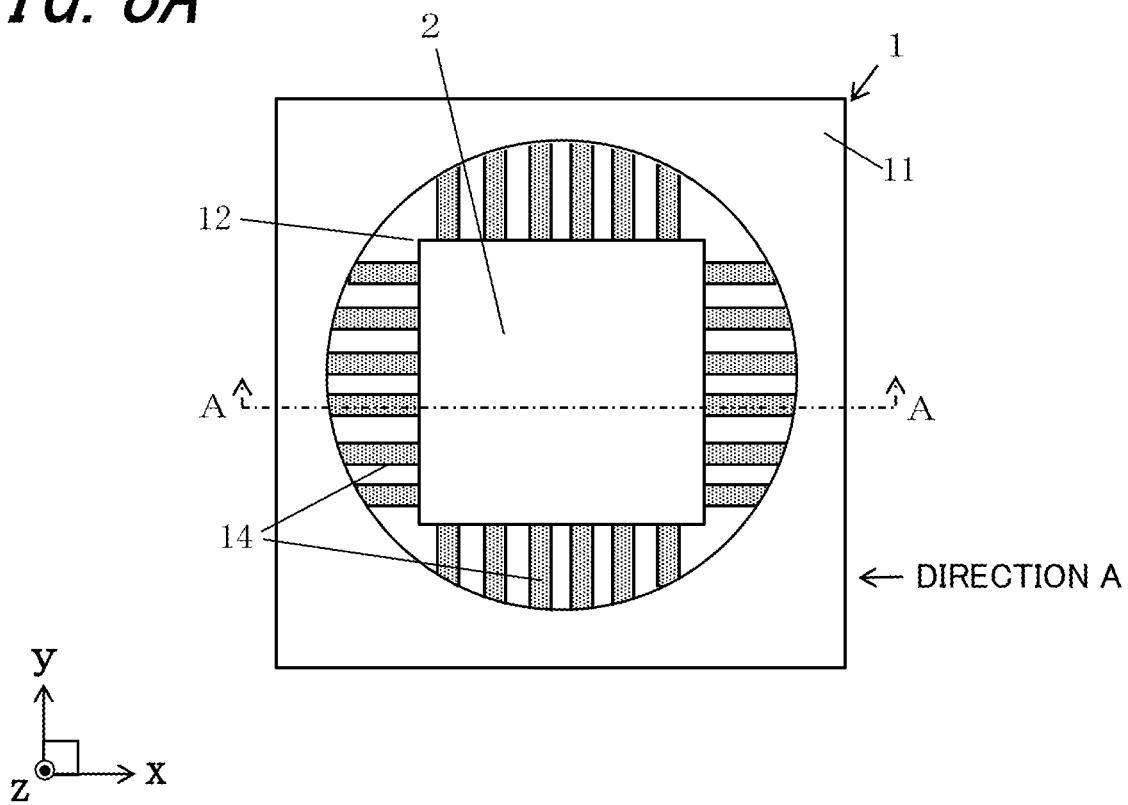
FIG. 8(A) is a top view of an electronic device in a third embodiment.
Figure 8B:
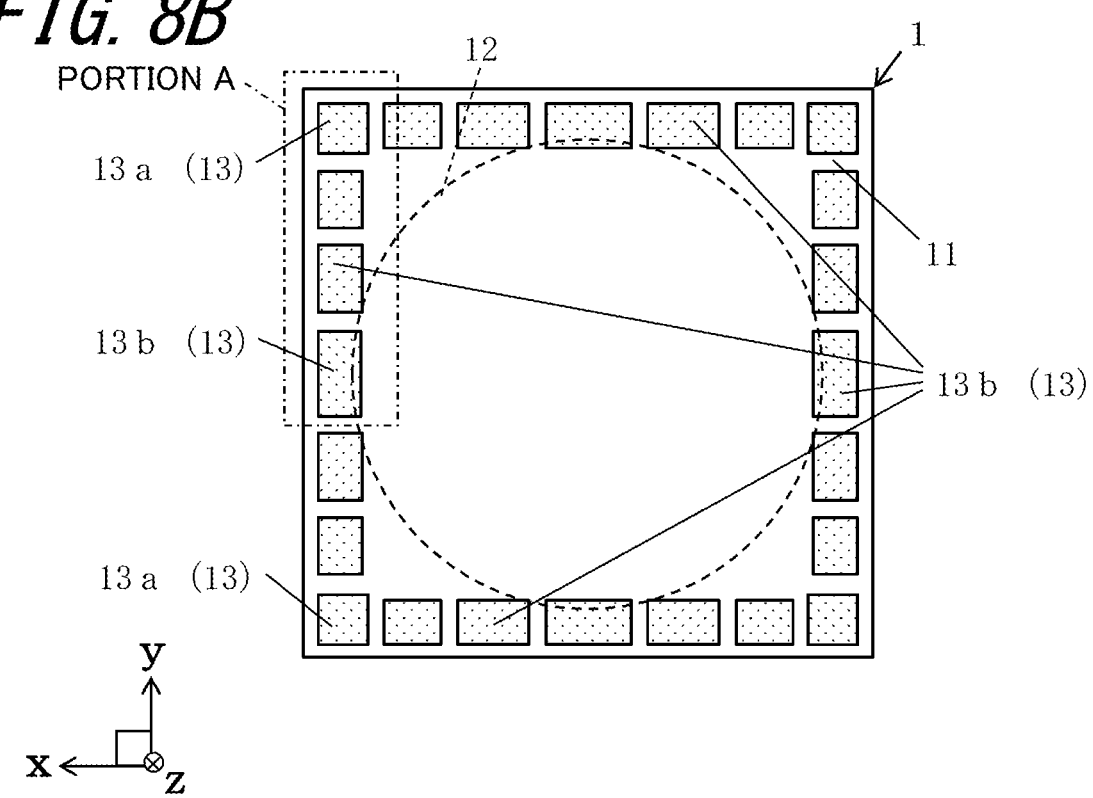
FIG. 8(B) is a bottom view of the electronic device in FIG. 8(A).

Next, an electronic device in a third embodiment will be described below with reference to FIGS. 8 to 10. The electronic device in the third embodiment is different from the electronic devices in the above-mentioned embodiments in that the recess 12 is circular in plan view. In the example illustrated in FIG. 8(A), the wiring conductors 14 are shaded. In the example illustrated in FIGS. 8(B), 9, and 10(B), the external electrodes 13 are shaded. In the example illustrated in FIG. 8(B), in perspective plan view, an area overlapping with an inner wall of the recess 12 is represented by a dotted line. In the example illustrated in FIGS. 8 to 10, in the wiring substrate 1 in the third embodiment, like the wiring substrate 1 in the second embodiment, the areas of the external electrodes 13 become gradually larger from the first external electrodes 13a located at the corners of the insulating substrate 11 toward the second external electrode 13b located at the center of each side.

In the wiring substrate 1 in the third embodiment, like the wiring substrate 1 in the first embodiment, for example, when the electronic device including the wiring substrate 1 is connected to the module substrate 4 via the solders 5, by decreasing the areas of the first external electrodes 13a to reduce the volumes of the solders 5 for connecting the first external electrodes 13a to the module substrate 4, in plan view, the volumes of the solders 5 for connecting the second external electrodes 13b interposed between the first external electrodes 13a to the module substrate 4 can be increased, thereby improving the connection between the second external electrodes 13b interposed between the first external electrodes 13a in plan view, and the module substrate 4. Further, by increasing the widths of the first external electrodes 13a in the direction orthogonal to each side of the insulating substrate 11, the connection of the first external electrodes 13a and the module substrate 4 can be improved.

In the example illustrated in FIGS. 8 to 10, twenty-four external electrodes 13 are arranged in a row in the peripheral section of the insulating substrate 11. In the example illustrated in FIGS. 8 to 10, seven external electrodes 13 are aligned along each side of the insulating substrate 11. Two first external electrodes 13a are located at the respective corners of the insulating substrate 11, and five second external electrodes 13b are interposed between the two first external electrodes 13a. In the example illustrated in FIGS. 8 to 10, the external electrodes 13 include the first external electrodes 13a located at the corners of the insulating substrate 11, and the second external electrodes 13b interposed between the first external electrodes 13a, that is, the 2-1 external electrodes 13*b*1, the 2-2 external electrodes 13*b*2, and the 2-3 external electrode 13*b*3.

In the example illustrated in FIG. 9, like the wiring substrate 1 in the second embodiment, it is given that the first external electrode 13*a* has a length L1 and a width W1, the second external electrode 13*b* has a length L2 (L21, L22, L23) and a width W2. In the example illustrated in FIGS. 8 to 10, L1<L21<L22<L23, W1>W2, Sa<Sb1<Sb2<Sb3 are satisfied.

In the wiring substrate 1 in the third embodiment, it is desirable that the external electrodes 13 be configured on two opposed sides of the insulating substrate 11 or on four sides of the insulating substrate 11, that is, the entire outer edge of the insulating substrate 11, in the similar manner to the wiring substrate 1 in the first embodiment or the wiring substrate 1 in the second embodiment.

The wiring substrate 1 in the third embodiment can be manufactured in the similar manner to the wiring substrates 1 in the above-mentioned embodiments.

Fourth Embodiment

Figure 11A:
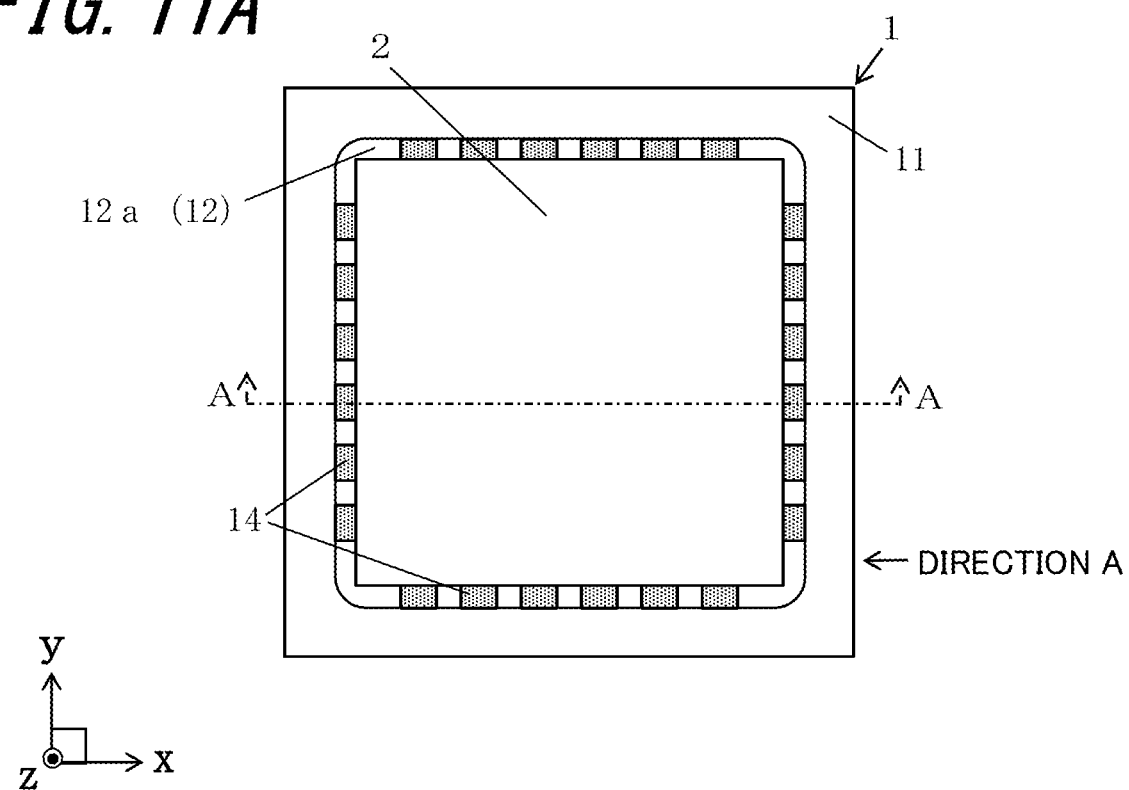
FIG. 11(A) is a top view of an electronic device in a fourth embodiment.
Figure 11B:
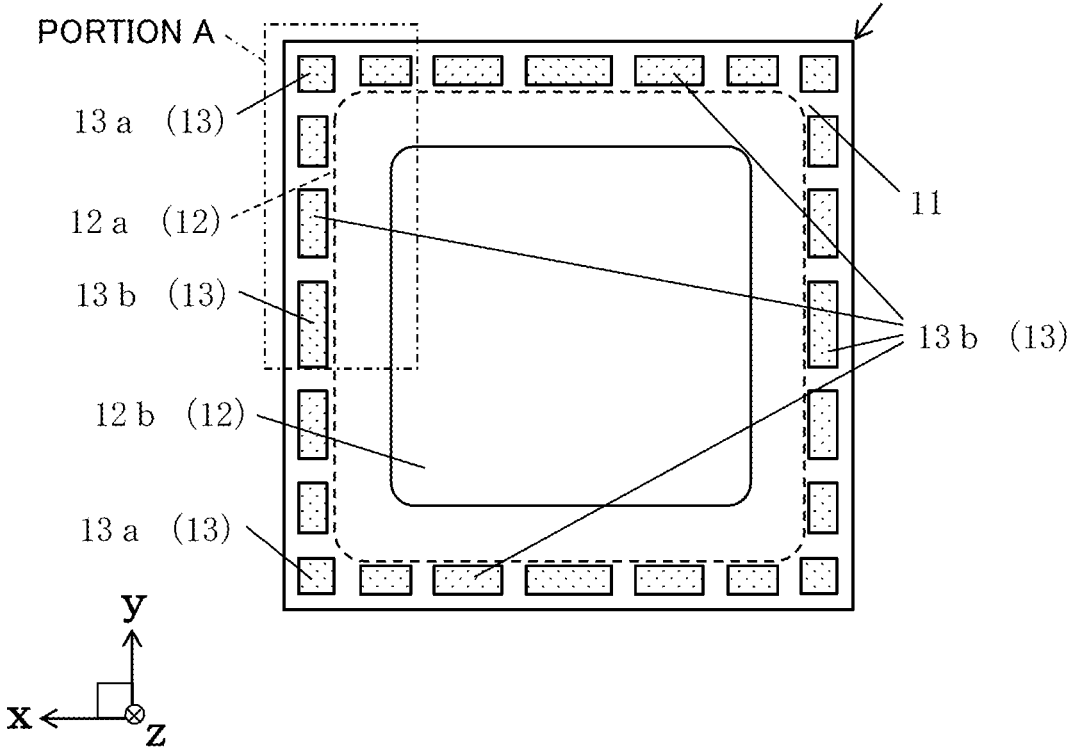
FIG. 11(B) is a bottom view of the electronic device in FIG. 11(A).
Figure 12:
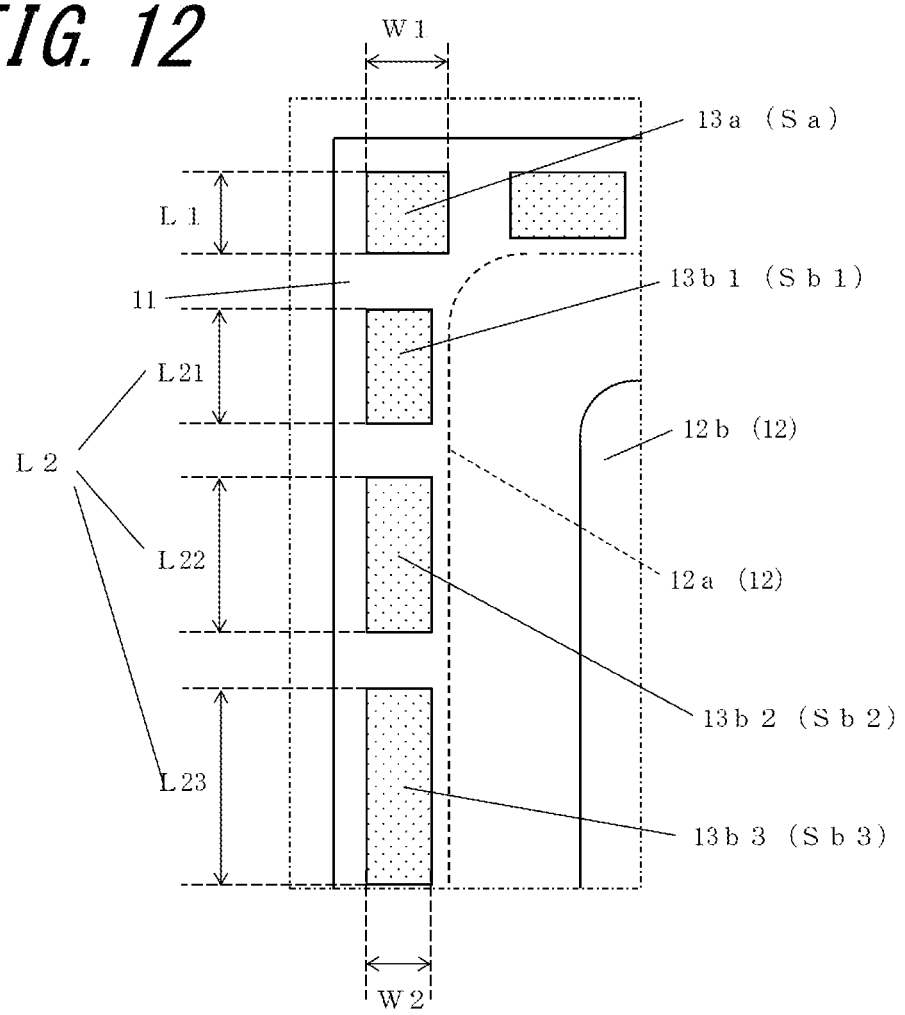
FIG. 12 is an enlarged bottom view of a main portion of an A portion of the electronic device in FIG. 11(B).

Next, an electronic device in a fourth embodiment will be described below with reference to FIGS. 11 to 13. The electronic device in the fourth embodiment is different from the electronic devices in the above-mentioned embodiments in that the insulating substrate 11 has a first recess 12*a* on one main surface (upper surface in FIGS. 11 to 13) of the insulating substrate 11 and a second recess 12*b* on the other main surface (lower surface in FIGS. 11 to 13) opposite to the one main surface of the insulating substrate 11, that is, recesses 12 are located at both main surfaces of the insulating substrate 11. In the example illustrated in FIG. 11(A), the wiring conductors 14 are shaded. In the example illustrated in FIGS. 11(B), 12, and 13(B), the external electrodes 13 are shaded. As illustrated in FIGS. 11(B) and 12, in perspective plan view, an area overlapping with an inner wall of the first recess 12*a* is represented by a dotted line. In the example illustrated in FIGS. 11 to 13, in the wiring substrate 1 in the fourth embodiment, like the wiring substrate 1 in the second embodiment, the areas of the external electrodes 13 become gradually larger from the first external electrodes 13*a* located at the corners of the insulating substrate 11 toward the second external electrode 13*b* located at the center of each side among the second external electrodes 13*b*, and the external electrodes 13 are located along the first recess 12*a* and the second recess 12*b* in perspective plan view.

In the wiring substrate 1 in the fourth embodiment, like the wiring substrate 1 in the first embodiment, for example, when the electronic device including the wiring substrate 1 is connected to the module substrate 4 via the solders 5, by decreasing the areas of the first external electrodes 13*a* to reduce the volumes of the solders 5 for connecting the first external electrodes 13*a* to the module substrate 4, in plan view, the volumes of the solders 5 for connecting the second external electrodes 13*b* interposed between the first external electrodes 13*a* to the module substrate 4 can be increased, thereby improving the connection of the second external electrodes 13*b* interposed between the first external electrodes 13*a* in plan view and the module substrate 4. Further, by increasing the widths of the first external electrodes 13*a* in the direction orthogonal to each side of the insulating substrate 11, the connection between the first external electrodes 13*a* and the module substrate 4 can be improved.

Providing that the second recess 12*b* located on the other main surface of the insulating substrate 11 has an area larger than the first recess 12*a* on the one main surface of the insulating substrate 11 in perspective plan view, for example, when the electronic device including the wiring substrate 1 is connected to the module substrate 4 via the solders 5, the volumes of the solders 5 for connecting the second external electrodes 13*b* interposed between the first external electrodes 13*a* in plan view to the module substrate 4 can be increased, thereby improving the connection of the second external electrodes 13*b* interposed between the first external electrodes 13*a* in plan view to the module substrate 4.

In the wiring substrate 1 in the fourth embodiment, the insulating substrate 11 is formed of four insulating layers 11*a*. The first recess 12*a* is provided in the first and second insulating layers 11*a* from the one main surface. The second recess 12*b* is provided in the fourth insulating layer 11*a* from the one main surface, that is, in the insulating layer 11*a* on the other main surface opposite to the one main surface. Such first recess 12*a* and second recess 12*b* may be manufactured in the similar manner to the above-mentioned recess 12.

In the example illustrated in FIGS. 11 to 13, twenty-four external electrodes 13 are arranged in a row in the peripheral section of the insulating substrate 11. In the example illustrated in FIGS. 11 to 13, seven external electrodes 13 are aligned along each side of the insulating substrate 11. Two first external electrodes 13*a* are located at the respective corners of the insulating substrate 11, and five second external electrodes 13*b* are interposed between the two first external electrodes 13*a*. In the example illustrated in FIGS. 11 to 13, the external electrodes 13 include the first external electrodes 13*a* located at the corners of the insulating substrate 11, and the second external electrodes 13*b* interposed between the first external electrodes 13*a*, that is, the 2-1 external electrodes 13*b*1, the 2-2 external electrodes 13*b*2, and the 2-3 external electrode 13*b*3.

In the example illustrated in FIG. 12, like the wiring substrate 1 in the second embodiment, it is given that the first external electrode 13*a* has a length L1 and a width W1, the second external electrode 13*b* has a length L2 (L21, L22, L23) and a width W2. In the example illustrated in FIGS. 11 to 13, L1<L21<L22<L23, W1>W2, Sa<Sb1<Sb2<Sb3 are satisfied.

In the wiring substrate 1 in the fourth embodiment, it is desirable that the external electrodes 13 be configured on two opposed sides of the insulating substrate 11 or on four sides of the insulating substrate 11, that is, the entire outer edge of the insulating substrate 11, in the similar manner to the wiring substrate 1 in the first embodiment or the wiring substrate 1 in the second embodiment.

The wiring substrate 1 in the fourth embodiment can be manufactured in the similar manner to the wiring substrates 1 in the above-mentioned embodiments.

The present disclosure is not limited to the above-mentioned embodiments, and may be subjected to various modifications. For example, the insulating substrate 11 may be shaped as a square having a notched portion or chamfered portion on a side surface or corner in plan view. The insulating substrate 11 may be notched from a side surface to the other main surface, and a so-called castellation conductor may be connected to the external electrode 13 and located on the inner surface of the notch. In the present disclosure, such castellation conductor may not be included in the external electrode 13.

In the wiring substrates 1 in the first to fourth embodiments, in a vertical sectional view, the inner wall surface of the recess 12 is located perpendicular to the bottom surface of the recess 12. However, the inner wall surface of the recess 12 may be inclined such that the opening of the recess 12 is wider than the bottom surface of the recess 12. A metal layer may be located on the inner wall surface of the recess 12. For example, when a light-emitting element is used as the electronic component 2, since the metal layer having good reflectivity is located on the inner wall surface of the recess 12, the wiring substrate 1 can be suitably used as the wiring substrate 1 for a light-emitting device having good luminance.

In the wiring substrates 1 in the first to fourth embodiments, the external electrodes 13 are square in plan view and however, may be circular or polygonal.

The wiring substrates 1 in the first to fourth embodiments may be combined with each other. For example, in the wiring substrate 1 in the first embodiment, the recess 12 may be circular in plan view. In the wiring substrate 1 in the fourth embodiment, the recess 12 in either of the main surfaces or the recesses 12 in both main surfaces may be circular in plan view.

In the wiring substrates 1 in the first to fourth embodiments, five of the second external electrodes 13b are interposed between the two first external electrodes 13a along each side of the insulating substrate 11. Three, four, or six or more of the second external electrodes may be interposed between two first external electrodes 13a.

In the above-mentioned embodiments, the insulating substrate 11 is configured of three insulating layers 11a or four insulating layers 11a. However, the insulating substrate 11 may be configured of two or five or more of the insulating layers 11a. The recess 12 may be a stepped recess 12 in a vertical sectional view.

The wiring substrate 1 may be manufactured as multiple wiring substrates.

The invention claimed is:

1. A wiring substrate comprising:
   an insulating substrate comprising one main surface with a recess, and the other main surface opposite to the one main surface, the insulating substrate being square in plan view of the one main surface; and
   external electrodes located in a peripheral section of the other main surface of the insulating substrate, wherein
   the external electrodes comprise first external electrodes and second external electrodes, and
   in plan view of the other main surface, the first external electrodes are located at corners of the insulating substrate, the second external electrodes are interposed between the first external electrodes, and each of the first external electrodes has a smaller area and a larger width in a direction orthogonal to each side of the insulating substrate than each of the second external electrodes.

2. The wiring substrate according to claim 1, wherein the first external electrodes and the recess do not overlap each other in perspective plan view.

3. The wiring substrate according to claim 1, wherein in the first external electrode, a length in a direction parallel to each side of the insulating substrate is equal to a width in the direction orthogonal to the side of the insulating substrate.

4. The wiring substrate according to claim 1, wherein a difference in width between the first external electrode and the second external electrode in the direction orthogonal to each side of the insulating substrate is equal to a difference in width between the first external electrode and the second external electrode in the direction orthogonal to a side adjacent to the side of the insulating substrate.

5. An electronic device comprising:
the wiring substrate according to claim 1; and
an electronic component mounted on the wiring substrate.

6. An electronic module comprising:
a module substrate comprising a connection pad; and
the electronic device according to claim 5 connected to the connection pad via a solder.

7. The wiring substrate according to claim 2, wherein in the first external electrode, a length in a direction parallel to each side of the insulating substrate is equal to a width in the direction orthogonal to the side of the insulating substrate.

8. The wiring substrate according to claim 2, wherein a difference in width between the first external electrode and the second external electrode in the direction orthogonal to each side of the insulating substrate is equal to a difference in width between the first external electrode and the second external electrode in the direction orthogonal to a side adjacent to the side of the insulating substrate.

9. The wiring substrate according to claim 3, wherein a difference in width between the first external electrode and the second external electrode in the direction orthogonal to each side of the insulating substrate is equal to a difference in width between the first external electrode and the second external electrode in the direction orthogonal to a side adjacent to the side of the insulating substrate.

10. The wiring substrate according to claim 7, wherein a difference in width between the first external electrode and the second external electrode in the direction orthogonal to each side of the insulating substrate is equal to a difference in width between the first external electrode and the second external electrode in the direction orthogonal to a side adjacent to the side of the insulating substrate.

* * * * *